US006940313B2

(12) United States Patent
Anders et al.

(10) Patent No.: US 6,940,313 B2
(45) Date of Patent: Sep. 6, 2005

(54) DYNAMIC BUS REPEATER WITH IMPROVED NOISE TOLERANCE

(75) Inventors: Mark Anders, Hillsboro, OR (US); Ram Krishnamurthy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,278

(22) Filed: Jun. 29, 2001

(65) Prior Publication Data

US 2003/0001184 A1 Jan. 2, 2003

(51) Int. Cl.[7] .............................................. H03K 19/096
(52) U.S. Cl. ........................................ 326/97; 327/200
(58) Field of Search .............................. 326/26, 36, 93, 326/94, 95, 96, 97, 98, 112, 121, 534, 81, 82; 327/175, 544, 534, 530, 537, 546, 564, 566, 542, 603, 18, 543; 257/298, 236, 259, 341, 351, 357, 369, 347; 365/226; 307/130

(56) References Cited

U.S. PATENT DOCUMENTS

| | | | | |
|---|---|---|---|---|
| 6,069,513 A | * | 5/2000 | Rossi et al. | 327/215 |
| 6,215,159 B1 | * | 4/2001 | Fujita et al. | 257/369 |
| 6,225,846 B1 | * | 5/2001 | Wada et al. | 327/215 |
| 6,510,503 B2 | * | 1/2003 | Gillingham et al. | 711/167 |

FOREIGN PATENT DOCUMENTS

JP     406164327 A * 6/1994

* cited by examiner

Primary Examiner—B. William Baumeister
Assistant Examiner—Dana Farahani
(74) Attorney, Agent, or Firm—Fish & Richardson P.C.

(57) ABSTRACT

In an embodiment, a dynamic bus includes a dynamic bus repeater with a noise margin of about Vcc/2. The bus repeater splits the bus into front and rear segments. The front segment pre-charges while the rear segment evaluates, and vice versa. The dynamic bus repeater hides the pre-charge signal propagated from the front segment from the rear segment while the rear segment is evaluating.

16 Claims, 4 Drawing Sheets

DYNAMIC BUS REPEATER WITH IMPROVED NOISE TOLERANCE

BACKGROUND

The length of interconnects between and within microprocessor data paths in functional unit blocks has increased as integration density has increased in integrated circuits (ICs). Because interconnect capacitance per unit length increases rapidly with lateral dimension scaling, long point-to-point interconnects may cause performance and power bottlenecks in ICs.

The substitution of dynamic CMOS interconnect drivers for static CMOS drivers in high performance on-chip busses has been explored. In busses with static drivers, when neighboring wires switch in the opposite directions, e.g., from Vss to Vcc on one wire and from Vcc to Vss on its neighbor, the voltage drop on the terminal of the parasitic capacitor between the two wires is not Vcc-Vss, but is doubled to (Vcc-Vss)*2. Due to the Miller effect, the effective capacitance seen by the wire is doubled, yielding a Miller Coupling Factor (MCF) of 2.0. In busses with dynamic drivers, all wires are reset to a pre-charge state (for example, Vss) in a pre-charge portion of the clock cycle, and then may either remain at that state or switch to an opposite state (Vcc in this example) in an evaluate portion of the cycle. Thus two neighboring wires cannot switch in opposite directions from the pre-charge state, and the maximum voltage drop on the terminals of the parasitic capacitors between the two wires will be (Vcc-Vss). Thus, the MCF is reduced from 2.0 in static CMOS drivers to 1.0 in dynamic CMOS drivers, thereby reducing a large component of the wire's worst-case effective coupling capacitance. However, dynamic circuits tend to be more susceptible to noise than static circuits. This may not present a problem in circuits where the inputs are well shielded, but may present a problem in dynamic busses, where the distance from the driver and the large resistance of the interconnect isolate the end of a bus segment from its restoring impedance.

DETAILED DESCRIPTION

Figure 1:
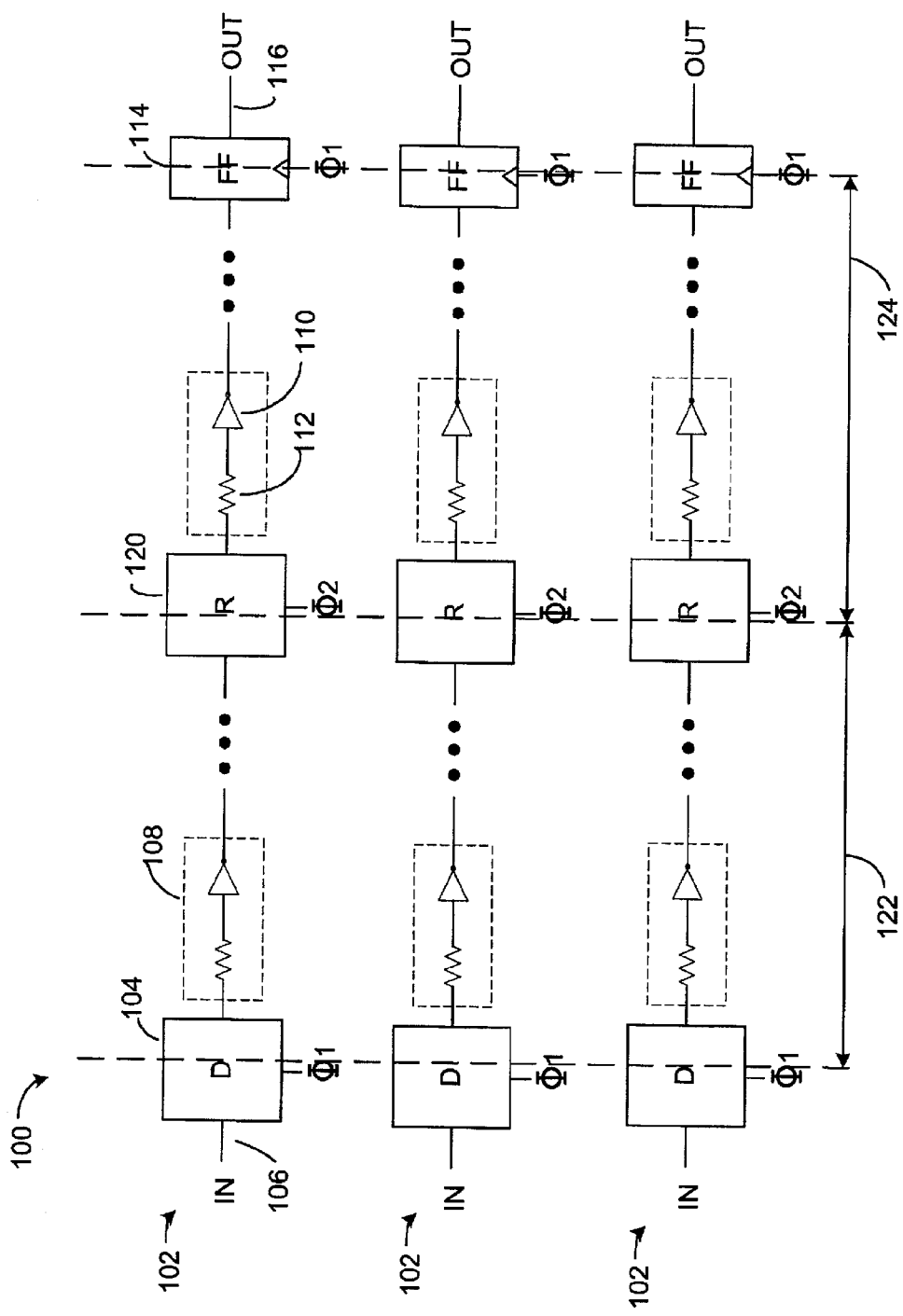
FIG. 1 is schematic diagram of a dynamic bus according to an embodiment.

FIG. 1 illustrates a dynamic bus 100 according to an embodiment. The bus includes multiple bus lines 102. The bus lines may be arranged as domino data paths, each bus line including a dynamic driver 104 at the input 106, a series of inverting stages 108, each including a CMOS inverter 110 and a wire resistance 112, and a clocked flip flop (FF) 114 at the output 116. A dynamic bus repeater 120 in the middle of the bus line divides the bus line into a front segment 122 and a rear segment 124.

The driver 104 and the FF 114 are clocked by a Φ1 clock. The dynamic repeater is clocked by a Φ2 clock. Each clock splits a clock cycle into a precharge phase and an evaluate phase. In the precharge phase, the output node of the circuits in the dynamic bus are "pre-charged" to Vcc or Vss (alternating between inverting stages). In the evaluate phase, the output node of each circuit is conditionally charged to Vcc (or discharged to Vss) based on its input. Thus, during the evaluate phase each circuit will either transition between Vcc and Vss or be quiescent.

Figure 2:
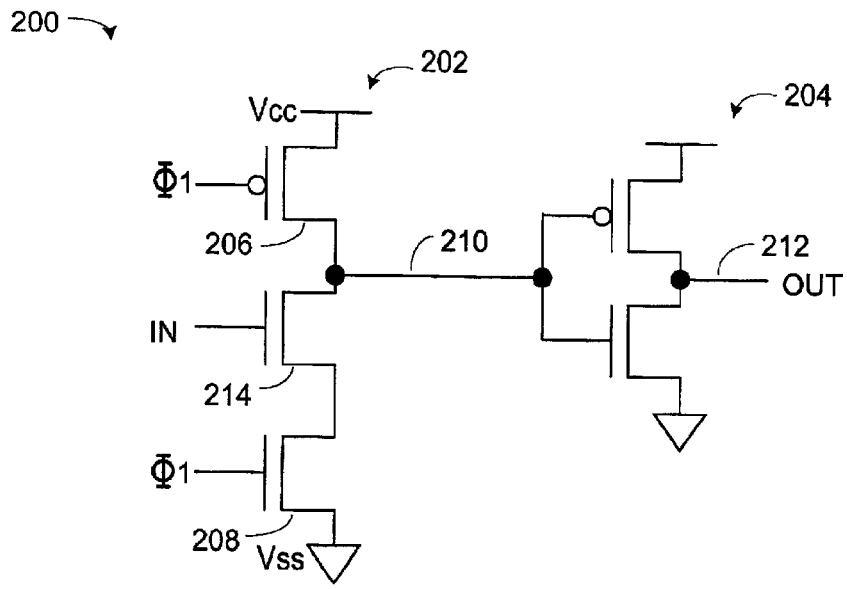
FIG. 2 is a circuit diagram of a dynamic driver according to an embodiment.

FIG. 2 is a circuit diagram of an exemplary dynamic driver 200. The driver includes a domino gate 202 and an inverter 204. In the pre-charge phase, the Φ1 clock signal is LOW. PMOS transistor 206 is turned on, providing a path from Vcc, and NMOS transistor 208 is turned off, closing the path to Vss. This pulls intermediate node 210 HIGH, which is inverted to a LOW signal by the inverter 204. The LOW pre-charge signal propagates through the bus line, pre-charging the output nodes of the inverters 110, FF 114, and dynamic repeater 120.

In the evaluate phase, the Φ1 clock signal transitions HIGH, turning off the PMOS transistor 206 and turning on the NMOS transistor 208. If the data signal input to the driver is HIGH, an input NMOS transistor 214 turns on and opens a path to Vss through NMOS transistor 208, pulling the intermediate node 210 LOW, which is inverted to a HIGH signal at the output node 212. This HIGH data signal propagates through the bus line. If the input data signal is LOW, the input NMOS transistor is off, blocking the path to Vss. Consequently, the intermediate node 210 remains HIGH, and the output node remains LOW.

The dynamic repeater splits the bus line into front and rear segments. The Φ2 clock is timed so that the rear segment of the bus is pre-charging while the front segment evaluates, and vice versa. In this manner, the pre-charge signal generated at the output node of the dynamic driver during pre-charge does not have to propagate through the entire bus line before the driver can evaluate a data signal at its input. The dynamic repeater has a latching function that hides the pre-charge state of the front segment from the rear segment while the rear segment is evaluating.

The Φ2 clock signal is approximately an inversion of the Φ1 signal. However, there may be an overlap window to account for clock skew. Also, the Φ2 clock may be timed so that Φ2 goes HIGH and places the dynamic repeater in evaluate mode slightly before the data signal from the front segment reaches the input node of the repeater. During the period between entering the evaluate mode and possibly receiving the data signal, the repeater is most susceptible to noise in the bus. If the noise exceeds the repeater's noise margin, the input transistor could switch, causing a false data signal to propagate down the rear segment of the bus line.

Dynamic bus repeaters may increase speed and decrease power consumption in the bus compared to static bus repeaters, but may be more susceptible to noise. Static inverters in busses can have a noise margin of about Vcc/2, i.e., a direct current (DC) input voltage of Vcc/2 produces an equal DC output voltage of Vcc/2. In a standard domino dynamic repeater, the noise margin may be only slightly higher than the threshold voltage, $V_T$, of the input transistor. While this may be acceptable for circuits where the inputs are well shielded, dynamic busses may be particularly susceptible to capacitive coupling and other sources of noise because the distance from of the repeater from the driver and the large resistance of the long interconnect isolate the repeater from its restoring impedance.

Figure 3:
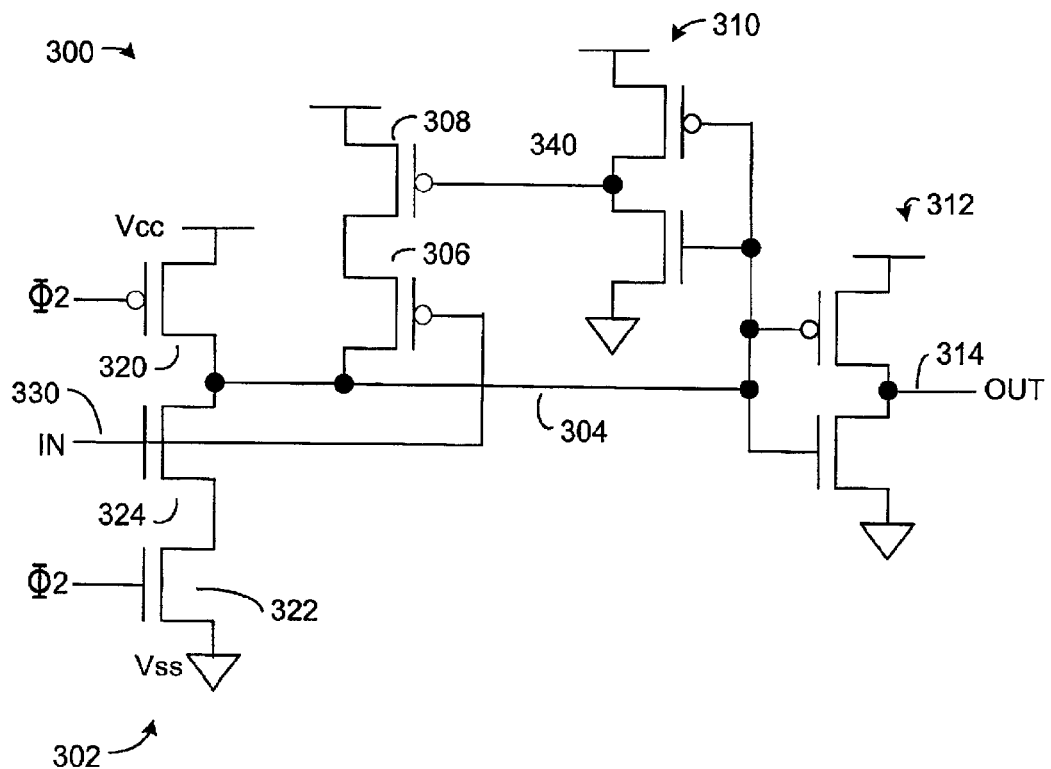
FIG. 3 is a circuit diagram of a dynamic repeater according to an embodiment.

FIG. 3 is a circuit diagram of a dynamic bus repeater 300 with an improved noise margin of about Vcc/2. The dynamic repeater includes a domino gate 302, an intermediate node 304, two pull-up PMOS transistors 306 and 308, a feedback inverter 310 and an output inverter 312. In this embodiment, the pre-charge state of the input node of the dynamic repeater is LOW (Vss). In an alternate embodiment, described in connection with FIG. 5, the front segment includes an additional inverter stage, and the pre-charge state of the input node of the dynamic repeater is HIGH (Vcc).

In the present embodiment, the intermediate node 304 is HIGH in the pre-charge state and the output node 314 is LOW. The repeater enters the evaluate mode when Φ2 goes HIGH, turning the top PMOS transistor 320 in the domino gate 302 OFF and turning the bottom NMOS transistor 322 ON. While the input node remains at the LOW pre-charge state, an input NMOS transistor 324 remains OFF, thereby maintaining the HIGH state of the intermediate node 304 and LOW state of the output node 314. Any noise signals at the input node of the dynamic repeater must exceed the noise margin of Vcc/2 for a sufficient amount of time to cause the input NMOS to turn ON, thereby providing a path to Vss and pulling the intermediate node LOW, consequently causing the output node to transition to a HIGH state.

The feedback inverter 310 provides an additional delay to switching in response to a noise signal. When a noise signal exceeds Vcc/2, the input NMOS transistor 324 starts to turn on, opening a path to Vss, and starts to turn off the lower pull-up PMOS transistor 306, closing the path to Vcc. As the path to Vcc begins to close and the path to Vss to open, the voltage on the intermediate node 304 begins to drop from HIGH to LOW. This signal starts to activate the feedback inverter 310. After a sufficient amount of time, the signal at the node 340 at the input of the top pull-up PMOS transistor 308 would transition fully from LOW to HIGH, turning off the upper pull-up PMOS transistor and completely closing the path to Vcc. However, this feedback path produces a delay in closing the path to Vcc. Thus, the noise signal must exceed Vcc/2 for a sufficient amount of time to cause the output node to switch to a HIGH state.

While the rear segment of the bus is evaluating, the dynamic repeater hides the pre-charge signal propagating through the front segment from the rear segment. If the data signal was HIGH in the previous cycle, then the input NMOS transistor is ON, the intermediate node 304 is LOW, and the output node 314 is HIGH in the evaluate phase of that cycle. When the pre-charge signal for the present cycle reaches the input node 330, the LOW signal turns off the input NMOS transistor 324, and turns on the lower pull-up PMOS transistor 306. However, the LOW signal on the intermediate node 304 and inverted to a HIGH signal by the feedback inverter 310 maintains the upper pull-up PMOS in the OFF state, providing no path to Vcc. Thus, the intermediate node 304 remains LOW and the output node remains HIGH, thereby hiding the pre-charge signal from the rear segment of the bus. If the data signal was LOW in the previous cycle, the LOW pre-charge signal will not change the state of bus, including the rear segment.

Figure 4:
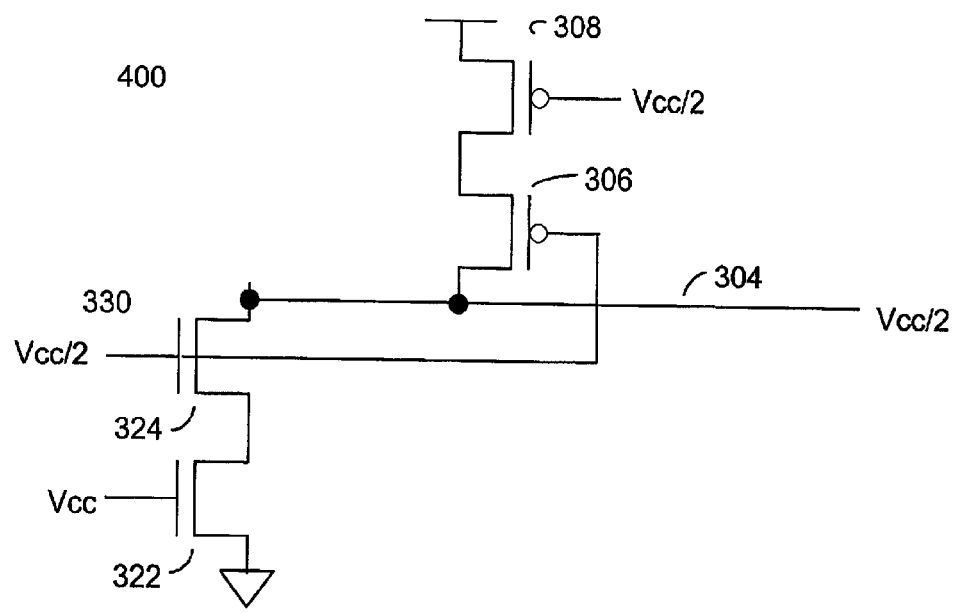
FIG. 4 is an equivalent circuit diagram of the circuit diagram shown in FIG. 3 at Vcc/2.

The transistors in the repeater must be sized to provide the circuit with a noise margin of Vcc/2. The pull-up PMOS transistors, the input transistor 324, and the bottom NMOS transistor 322 are sized in a ratio such that an equivalent circuit including these transistors, shown in FIG. 4, has a noise margin of Vcc/2. With Φ2 HIGH, the top PMOS transistor is OFF and may be removed from the equivalent circuit. The feedback inverter 310 and output inverter 312 are static CMOS inverters, each with a noise margin of Vcc/2. Thus, with the output node of the repeater at Vcc/2 (the noise margin state), the input nodes of the output inverter and feedback inverter at intermediate node 304 and node 340, respectively, are also at Vcc/2. Since the inputs and outputs of the inverters are equal, they may be removed from the equivalent circuit. The remaining transistors in the equivalent circuit may be sized to achieve the noise margin state.

Figure 5:
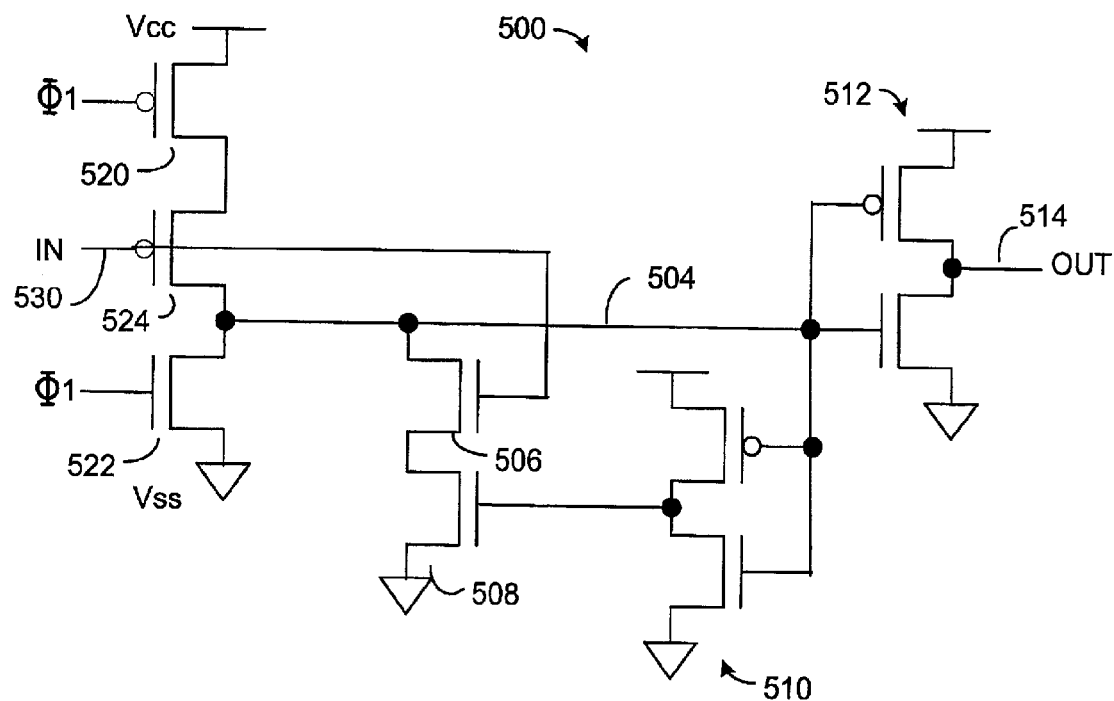
FIG. 5 is a circuit diagram of a dynamic repeater according to an alternative embodiment.

FIG. 5 is a circuit diagram of an alternate embodiment of the dynamic repeater 500 in which the pre-charge state of the input node is HIGH. As described above, the front segment may have one more (or less) inverting stage than the bus shown in FIG. 1, thereby inverting the LOW pre-charge signal issued by the dynamic driver.

The dynamic repeater 500 includes a domino gate 502, an intermediate node 504, two pull-down NMOS transistors 506 and 508, a feedback inverter 510 and an output inverter 512. The upper PMOS transistor 520 and lower NMOS transistor 522 of the domino gate are clocked by the Φ1 clock. The timing scheme of the Φ1 clock is such that the repeater enters the evaluate mode slightly before the data signal from the first segment reaches the repeater. For example, the Φ1 clock signal to the dynamic driver may be delayed to achieve this timing condition.

In the present embodiment, the intermediate node 504 is LOW in the pre-charge state and the output node 514 is HIGH. The repeater 500 enters the evaluate mode when Φ1 goes LOW, turning top PMOS transistor 520 ON and turning the bottom NMOS transistor 522 OFF. While the input node remains at the HIGH pre-charge state, the input PMOS transistor 524 remains OFF, thereby keeping the path to Vcc closed and maintaining the LOW state of the intermediate node 504 and HIGH state of the output node 514. Any noise signals at the input node of the dynamic repeater must exceed the noise margin of Vcc/2 for a sufficient amount of time to cause the input PMOS transistor 524 to turn ON, thereby providing a path to Vcc and pulling the intermediate node HIGH, consequently causing the output node to transition to a LOW state.

The circuit operates in a manner similar to the dynamic repeater shown in FIG. 3, with NMOS pull-down transistors providing a path to Vss rather than Vcc. As described above, the feedback inverter provides an additional delay to the circuit.

While the rear segment of the bus is evaluating, the dynamic repeater hides the pre-charge signal propagating through the front segment from the rear segment. If the inverted data signal was LOW in the previous cycle, then the input PMOS transistor is ON, the intermediate node is HIGH, and the output node is LOW in the evaluate phase of that cycle. When the inverted (HIGH) pre-charge signal for the present cycle reaches the input node, the HIGH signal turns off the input PMOS transistor, and turns on the upper pull-down NMOS transistor. However, the HIGH signal on the intermediate node and inverted to a LOW signal by the feedback inverter maintains the lower pull-down NMOS in the OFF state, providing no path to Vss. Thus, the intermediate node remains HIGH and the output node LOW, thereby hiding the pre-charge signal from the rear segment of the bus. If the inverted data signal was HIGH in the previous cycle, the inverted (HIGH) pre-charge signal will not change the state of bus, including the rear segment.

Figure 6:
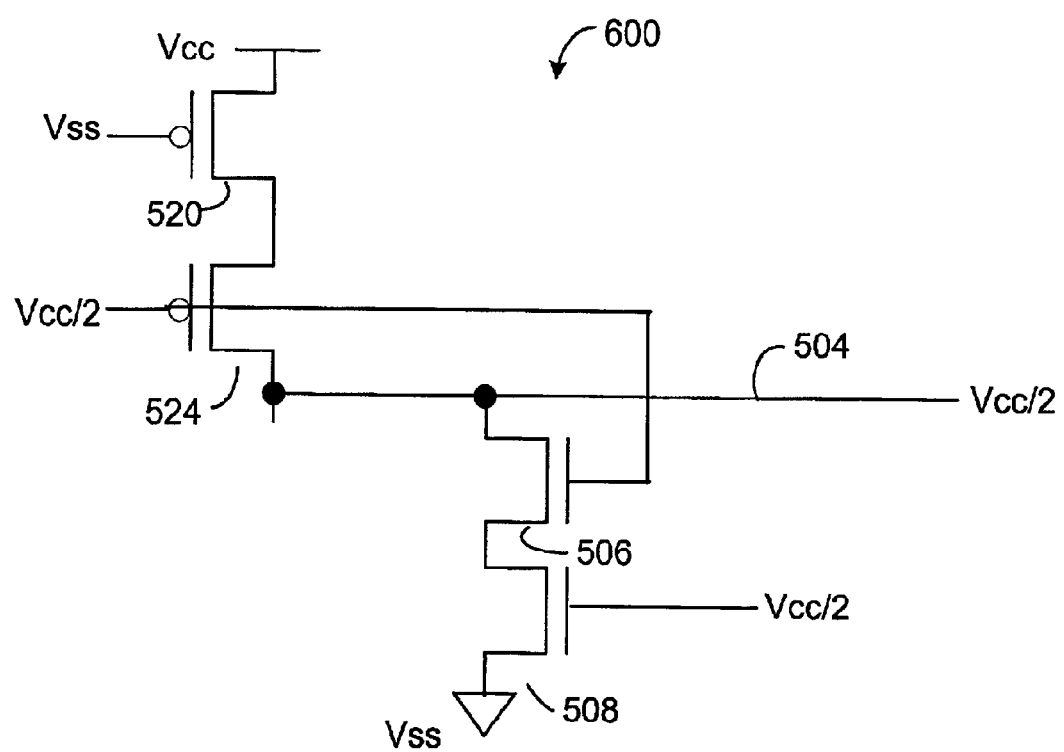
FIG. 6 is an equivalent circuit diagram of the circuit diagram shown in FIG. 5 at Vcc/2.

FIG. 6 is an equivalent circuit of that shown in FIG. 5 at the noise margin state and illustrates the transistors to size to achieve a noise margin of Vcc/2. In the present embodiment, the lower NMOS transistor 522 and inverters 510 and 512 drop out, and the upper PMOS transistor 520 and the input PMOS transistor 524 of the domino gate 502 and pull-down NMOS transistors 506 and 508 must be sized to achieve a noise margin of Vcc/2.

A number of embodiments have been described. Nevertheless, it will be understood that various modifications may be made without departing from the spirit and scope of the invention. For example, steps of the various operations may be performed in a different order and still achieve desirable results. Accordingly, other embodiments are within the scope of the following claims.

What is claimed is:

1. A dynamic repeater comprising:
an input gate including an input transistor having an input node and two or more clocked input gates operative to place the repeater in a pre-charge mode in response to a first clock signal and to place the repeater in an evaluate mode in response to a second clock signal;
an output node; and
a plurality of transistors coupled between the input transistor and the output node,
wherein the input transistor and said plurality of transistors are sized in a ratio such that the output node is operative to output a voltage of Vcc/2 in response to a voltage of Vcc/2 on the input node in the evaluate mode.

2. The repeater of claim 1, wherein the clocked transistors include a PMOS transistor coupled to Vcc and an NNOS transistor coupled to Vss, the input transistor being connected between said PMOS and NMOS transistors.

3. The repeater of claim 1, further comprising:
an intermediate node coupled to one of a source and a drain of the input transistor;
an output inverter having an output coupled to the output node and an input coupled to the intermediate node, and
wherein said plurality of transistors comprise:
a first transistor having a gate coupled to the input node and one of a source and a drain connected to the intermediate node; and
a second transistor connected in series with the first transistor, said second transistor having one of a source and a drain connected to a voltage supply.

4. The repeater of claim 3, wherein the repeater has a noise margin of about Vcc/2.

5. The repeater of claim 3, further comprising a feedback inverter having an input coupled to the intermediate node and an output coupled to a gate of the second transistor.

6. The repeater of claim 3, wherein the first and second transistors comprise PMOS transistors, wherein the reference voltage is Vcc, and wherein the input transistor is an NMOS transistor.

7. The repeater of claim 6, wherein the repeater is operative to latch a LOW signal on the intermediate node during the evaluate mode in response to receiving a HIGH data signal at the input node.

8. The repeater of claim 3, wherein the first and second transistors comprise NNOS transistors, wherein the reference voltage is Vss, and wherein the input transistor is an PMOS transistor.

9. The repeater of claim 8, wherein the repeater is operative to latch a HIGH signal on the intermediate node during the evaluate mode in response to receiving a LOW data signal at the input node.

10. A dynamic bus comprising:
a plurality of bus lines, each bus line including
a dynamic driver at an input,
a clocked flip flop at an output,
a plurality of inverting stages connected between the driver and the flip flop, and
a dynamic repeater connected between two of said inverting stages, said dynamic repeater having a noise margin of about Vcc/2, the dynamic repeater comprising:
an input gate including an input transistor having an input node and two or more clocked input gates operative to place the repeater in a pre-charge mode in response to a first clock signal and to place the repeater in an evaluate mode in response to a second clock signal;
an output node; and
a plurality of transistors coupled between the input transistor and the output node,
wherein the input transistor and said plurality of transistors are sized in a ratio such that the output node is operative to output a voltage of Vcc/2 in response to a voltage of Vcc/2 on the input node in the evaluate mode.

11. The bus of claim 10, wherein each bus line includes a first segment and a second segment separated by the dynamic repeater, and
wherein the driver is operative to alternate the first segment between a pre-charge mode and an evaluate mode, and
wherein the dynamic repeater is operative to place the second segment in the evaluate mode while the first segment is in the pre-charge mode and to place the second segment in the pre-charge mode while the first segment is in the evaluate mode.

12. The bus of claim 11, wherein the dynamic repeater is operative to latch a signal during the evaluate phase regardless of the state of the first segment.

13. The bus of claim 11, wherein an input node of the driver is operative to be pre-charged to a first signal, and wherein an input node of the repeater is operative to be pre-charged to the first signal.

14. The bus of claim 13, wherein the driver is operative to switch between the pre-charge mode and the evaluate mode in response to a first clock signal and the repeater is operative to switch between the pre-charge mode and the evaluate mode in response to a second clock signal,
wherein the second signal is approximately the inverse of the first signal.

15. The bus of claim 11, wherein an input node of the driver is operative to be pre-charged to a first signal, and wherein an input node of the repeater is operative to be pre-charged to a second signal,
wherein the second signal is the inverse of the first signal.

16. The bus of claim 15, wherein the driver is operative to switch between the pre-charge mode and the evaluate mode in response to a first clock signal and the repeater is operative to switch between the pre-charge mode and the evaluate mode in response to the first clock signal.

* * * * *